(12) United States Patent
Barnes et al.

(10) Patent No.: US 8,323,801 B2
(45) Date of Patent: Dec. 4, 2012

(54) PROCESS FOR FORMING A DURABLE LOW EMISSIVITY MOISTURE VAPOR PERMEABLE METALLIZED SHEET INCLUDING A PROTECTIVE METAL OXIDE LAYER

(75) Inventors: John James Barnes, Hockessin, DE (US); Ioannis V. Bletsos, Midlothian, VA (US); Angelo Yializis, Tucson, AZ (US); Michael G. Mikhael, Tucson, AZ (US)

(73) Assignee: E I du Pont de Nemours and Company, Wilmington, DE (US)

( * ) Notice: Subject to any disclaimer, the term of this patent is extended or adjusted under 35 U.S.C. 154(b) by 1015 days.

(21) Appl. No.: 11/334,211

(22) Filed: Jan. 18, 2006

(65) Prior Publication Data
US 2007/0166528 A1    Jul. 19, 2007

(51) Int. Cl.
  B32B 9/02    (2006.01)
  B32B 15/04   (2006.01)
  B32B 27/12   (2006.01)
  D06N 7/04    (2006.01)

(52) U.S. Cl. .................. 428/469; 428/472.2; 428/137; 428/304.4; 428/376; 442/131

(58) Field of Classification Search .................. None
See application file for complete search history.

(56) References Cited

U.S. PATENT DOCUMENTS

| | | | |
|---|---|---|---|
| 4,842,893 A | 6/1989 | Yializis et al. | |
| 4,954,371 A | 9/1990 | Yializis | |
| 4,974,382 A | 12/1990 | Avellanet | |
| 4,999,222 A * | 3/1991 | Jones et al. | 427/250 |
| 5,032,461 A | 7/1991 | Shaw et al. | |
| 5,120,585 A | 6/1992 | Sutter et al. | |
| 5,547,508 A | 8/1996 | Affinito | |
| 5,955,175 A | 9/1999 | Culler | |
| 6,066,826 A | 5/2000 | Yializis | |
| 6,083,628 A * | 7/2000 | Yializis | 428/463 |
| 6,270,841 B1 | 8/2001 | Mikhael et al. | |
| 6,660,339 B1 | 12/2003 | Datta et al. | |
| 2003/0136078 A1 | 7/2003 | Brown et al. | |
| 2004/0028931 A1 | 2/2004 | Bletsos et al. | |
| 2004/0053020 A1* | 3/2004 | Mashiko et al. | 428/209 |
| 2004/0241454 A1* | 12/2004 | Shaw et al. | 428/425.5 |
| 2006/0040091 A1 | 2/2006 | Bletsos et al. | |

(Continued)

FOREIGN PATENT DOCUMENTS

CN    15328797    3/2003

(Continued)

OTHER PUBLICATIONS

Hasnaoui et al., "Molecular dynamics simulations of the nano-scale room-temperature oxidation of aluminum single crystals", Surface Science 579 (2005) 46-57.*

(Continued)

Primary Examiner — David Sample
Assistant Examiner — Nicole T Gugliotta

(57) ABSTRACT

A process for forming a low emissivity, moisture vapor permeable metallized composite sheet by coating a moisture vapor permeable sheet with at least one metal and exposing the freshly deposited metal to an oxidizing plasma thereby forming a protective synthetic metal oxide over the metal. The composite sheet material is suitable for use as a building construction barrier layer such as roof lining and house wrap.

4 Claims, 4 Drawing Sheets

U.S. PATENT DOCUMENTS

2008/0057292 A1  3/2008  Bletsos et al.
2008/0060302 A1  3/2008  Bletsos et al.
2008/0187740 A1  8/2008  Bletsos et al.

FOREIGN PATENT DOCUMENTS

| EP | 1 400 348 A2 | 3/2004 |
|---|---|---|
| WO | WO 98/18852 | 5/1998 |
| WO | WO 99/58757 | 11/1999 |
| WO | WO 99/59185 | 11/1999 |
| WO | WO 01/28770 A1 | 4/2001 |

OTHER PUBLICATIONS

U.S. Appl. No. 10/924,218, filed Aug. 23, 2004, Bletsos et al.
Yiailzis et al., "Vacuum Surface Functionalization of Paper and Woven or Nonwoven Materials", 46th Annual Technical Conference Proceedings, Society of Vacuum Coaters, 505/856-7188, 2003.

* cited by examiner

PROCESS FOR FORMING A DURABLE LOW EMISSIVITY MOISTURE VAPOR PERMEABLE METALLIZED SHEET INCLUDING A PROTECTIVE METAL OXIDE LAYER

BACKGROUND OF THE INVENTION

The present invention relates to a process for preparing low emissivity moisture vapor permeable metallized sheets which have superior resistance to corrosion of the metal layer and low emissivity.

Moisture vapor permeable composite sheet products such as fabrics, films or composites thereof having deposited on at least one surface of the sheet a metal layer, e.g. aluminum, and a protective, outer polymeric coating, e.g. acrylate or lacquer, are useful as thermal and electromagnetic radiation barriers in building construction in the form of housewrap or roof lining (also referred to as "construction barrier layers"). When the composite sheet is used as a construction barrier layer, the metal layer reflects infrared radiation and transmits little infrared radiation, providing a thermal barrier that reduces energy loss and keeps the building cooler in the summer and warmer in the winter.

Such metalized sheets allow moisture vapor to pass through the sheet, thus preventing moisture condensation in insulation that is installed behind the sheet, while at the same time providing a barrier to air and liquid water and enhancing the energy efficiency of the building. U.S. Pat. No. 4,999,222 to Jones et al. describes moisture vapor permeable metallized polyethylene sheets having low emissivity prepared by calendering a plexifilamentary film-fibril sheet followed by vacuum metallization. U.S. Pat. No. 4,974,382 to Avellanet describes an infiltration and energy barrier that can be vapor permeable or impermeable having at least one metallized layer thereon. Published PCT International Application No. WO 01/28770 to Squires et al. describes breathable building membranes that include an under layer of microporous film and a top layer formed of a filamentous polymeric fabric, for example a spunbond fabric, which is provided with a moisture vapor permeable reflective metal coating. U.S. Patent Application Publication No. 2003/0136078 to Brown et al. describes a method of insulating a building that includes the step of introducing an insulating membrane comprising a reflective layer and a breathable textile layer into the cavity between the outer cladding layer and the frame. The metallized layer may optionally be coated with a protective layer of plastic or varnish to protect the metal surface.

BRIEF SUMMARY OF THE INVENTION

The present invention is directed to a process for forming a moisture vapor permeable metallized composite sheet comprising placing a porous moisture vapor permeable sheet in a vacuum chamber and drawing a vacuum within said vacuum chamber, depositing a metal coating onto at least one surface of a porous moisture vapor permeable sheet so as to substantially cover the outer surfaces of the moisture vapor permeable sheet while leaving the pores thereof substantially uncovered, and oxidizing the surface of the metal coating with an oxygen-containing plasma within said vacuum chamber to form a synthetic metal oxide coating.

Another embodiment of the present invention is a moisture vapor permeable metallized composite sheet comprising a porous moisture vapor permeable sheet having first and second outer surfaces and at least one multilayer coating comprising a metal coating having a thickness between about 15 nanometers and 200 nanometers deposited on the first outer surface of the porous moisture vapor permeable sheet, a synthetic metal oxide coating having a thickness of less than about 10 nm formed by oxidizing the metal coating with an oxygen-containing plasma, and an outer organic coating having a thickness between about 0.05 μm and about 1 μm deposited on the metal oxide coating, wherein the multilayer coating substantially covers the outer surface of the porous moisture vapor permeable sheet, while leaving the pores thereof substantially uncovered.

Another embodiment of the present invention is a construction barrier layer comprising a porous moisture vapor permeable sheet selected from the group consisting of nonwoven fabrics, woven fabrics, microporous films, microperforated films and composites thereof, having first and second outer surfaces and at least one multilayer coating comprising, a metal coating having a thickness between about 15 nanometers and 200 nanometers deposited on the first outer surface of the moisture vapor permeable sheet, a synthetic metal oxide coating having a thickness of less than about 10 nm formed by oxidizing the metal layer with an oxygen-containing plasma, and an outer organic coating having a thickness between about 0.05 μm and about 1 μm deposited on the metal layer, wherein the multilayer coating substantially covers the outer surface of the moisture vapor permeable sheet while leaving the pores substantially uncovered.

DETAILED DESCRIPTION OF THE INVENTION

Figure 1:
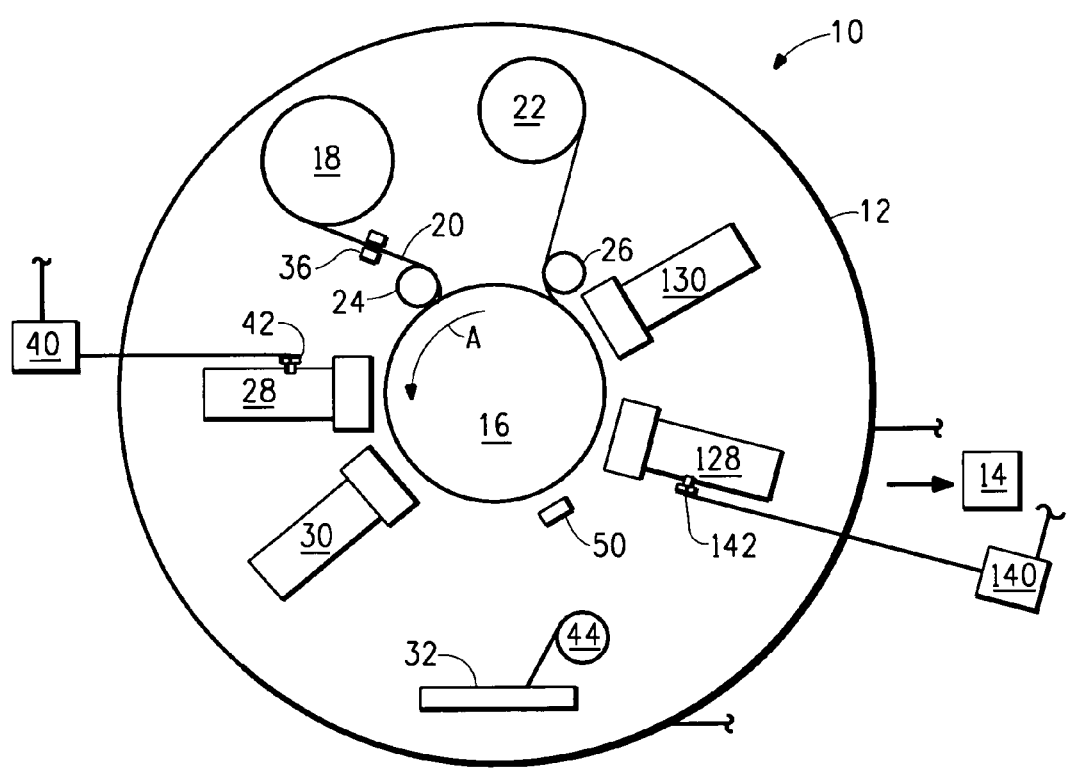
FIG. 1 is a schematic diagram of an apparatus suitable for forming a composite sheet of the present invention.

The terms "nonwoven fabric", "nonwoven sheet", "nonwoven layer", and "nonwoven web" as used herein refer to a structure of individual strands (e.g. fibers, filaments, or threads) that are positioned in a random manner to form a planar material without an identifiable pattern, as opposed to a knitted or woven fabric. The term "fiber" is used herein to include staple fibers as well as continuous filaments. Examples of nonwoven fabrics include meltblown webs, spunbond nonwoven webs, flash spun webs, staple-based webs including carded and air-laid webs, spunlaced webs, and composite sheets comprising more than one nonwoven web.

The term "plexifilamentary" as used herein, means a three-dimensional integral network or web of a multitude of thin, ribbon-like, film-fibril elements of random length and with a mean film thickness of less than about 4 microns and a median fibril width of less than about 25 microns. In plexifilamentary structures, the film-fibril elements are generally coextensively aligned with the longitudinal axis of the structure and they intermittently unite and separate at irregular intervals in various places throughout the length, width and thickness of the structure to form a continuous three-dimensional network. A nonwoven web of plexifilamentary film-fibril elements is referred to herein interchangeably as a "flash spun plexifilamentary sheet" and a "plexifilamentary film-fibril sheet." An example of a plexifilamentary film-fibril structure is flash spun polyolefin sheet sold under the trade name Tyvek® by E. I. du Pont de Nemours and Company (Wilmington, Del.).

In the conventional manufacture of metallized sheets suitable for use as construction barrier layers, the deposited metal layer is exposed to ambient conditions, including air and moisture, in some cases for several days before being covered with a protective polymeric coating. As a result of this exposure, a thin metal oxide layer is formed on the surface of the metal. The thickness of the oxide film increases for a period of several minutes to several days with continued exposure to air, after which the oxide layer reaches a thickness that prevents or significantly hinders contact of oxygen with the metal layer, reducing further oxidation.

Typically, the metal oxide is formed during storage or transportation and no extra care is taken to control the environment to which the metallized sheets are exposed. For example, in high humidity environments the oxide formed will be hydrated, which may initiate metal corrosion and compromise the quality of the metal layer before it is coated with an outer polymer coating. It was previously believed that the natural metal oxide layer that forms on the surface of the metal as a result of exposure to ambient conditions, known to be very thin (on the order of nanometers), would not provide much protection to the metal and would likely undesirably increase the emissivity of the metallized sheet.

It has been surprisingly discovered that the thin metal oxide layer actually provides some protection of the metal layer against corrosion while having virtually no or minimal impact on the emissivity of the metallized composite sheet.

Because the above described metallized composite sheets utilize conventional coating techniques, the moisture vapor permeability is undesirably low for use as construction barrier layers. As a result, alternative processes for forming metallized sheets suitable for use as construction barrier layers have been developed and are described in copending U.S. patent application Ser. No. 10/924,218, filed Aug. 23, 2004, incorporated herein by reference in its entirety. In these processes, the metal layer(s) and the polymeric coating(s) are deposited on a moisture vapor permeable sheet under vacuum, such that the polymeric coating is formed directly over the freshly deposited metal layer and no opportunity is available for metal oxide form on the metal layer. It has been found that, despite the presence of the protective polymeric coating, sheets formed by such processes are unfortunately susceptible to corrosion of the metal layer when the sheets are contacted with bare hands and then exposed to high temperature and relative humidity environments. It is believed that salts dissolved in human perspiration penetrate the polymeric coating to reach the metal layer. The metal layer of such products also undergoes corrosion when exposed to humid ambient environments if discontinuities exist in the polymeric coating.

The corrosion of the metal layer results in a number of undesirable effects. For one, the corrosion results in discoloration of the metal. In the case of an aluminum layer, this ranges from loss of metallic luster, to formation of gray or white areas, to the aluminum layer turning completely white, corresponding to the degree of conversion of aluminum to hydrated aluminum oxide or aluminum hydroxide. Aside from the poor appearance, the corrosion causes an increase in emissivity of the sheet, decreasing its insulating value. The corrosion of the metal also compromises the strength and integrity of the metal layer, resulting in a less durable product.

It would be desirable to have an economical, high throughput process for forming a durable, low emissivity metallized moisture vapor permeable sheet in which the metallization and polymeric coating process steps occur in a single pass in vacuum, and in which the resulting metallized sheet has retained is moisture vapor permeability and has good resistance to corrosion of the metal layer.

In one embodiment, the present invention relates to a process for forming moisture vapor permeable metallized composite sheets including vapor depositing a metal coating onto at least one surface of a porous moisture vapor permeable sheet and subsequently exposing the metal coating to a plasma field containing a source of free oxygen, e.g., in the form of oxygen gas, air, a mixture of oxygen and nitrogen, a mixture of oxygen and at least one noble gas, oxides of nitrogen or ozone, for a sufficient amount of time to oxidize a surface portion of the metal layer, thereby forming a synthetic metal oxide coating that protects the underlying metal coating from corrosion. The metal and synthetic metal oxide coatings are formed under vacuum and thus the synthetic metal oxide contains little, if any, metal hydrates, in contrast to natural metal oxide coatings formed under ambient conditions. The metal coating can be formed using vapor deposition techniques under conditions that substantially coat the sheet layer without significantly reducing its moisture vapor permeability. Since the synthetic metal oxide coating is formed by exposing the metal coating to an oxygen-containing plasma, the metal oxide coating is formed from the outer surface portion of the metal coating; therefore it covers only the metal coating, without covering the pores of the underlying sheet and reducing the moisture vapor permeability of the resulting composite sheet.

The process of the invention forms the metal oxide coating in milliseconds, which by contrast takes from several minutes to several days to form when a freshly deposited metal coating is exposed to ambient conditions. An advantage of the process of the invention is that the conditions at which the oxide is formed can be controlled in the vacuum in order to provide optimum protection against corrosion of the metal, and the metallized sheet can be over-coated with a protective coating before it is exposed to any ambient conditions including humidity.

The composite sheets formed by the process of the present invention include the following structures: Sheet/M/MO, Sheet/M/MO/L2, Sheet/L1/M/MO/L2, and Sheet/L1/M/L2/M/MO/L3, etc., where Sheet is a moisture vapor permeable sheet layer (also referred to herein as the starting sheet), M is a low emissivity metal coating, and L1, L2, and L3 are organic coatings comprising an organic polymer, organic oligomer, or combinations thereof, and MO is a synthetic metal oxide of the metal coating. The abbreviation "L1" is used herein to refer to an optional intermediate organic coating that can be deposited on a surface of the sheet layer prior to depositing a metal coating thereon. The intermediate coating has been found to improve the thermal barrier properties of the composite sheet compared to composite sheets that do not include an intermediate coating.

The composite sheets preferably include an "outer" organic coating overlying the metal oxide coating MO, such as L2 and L3 in the above-described structures. In composite sheet structures having more than one metal coating, individual metal coatings can be formed from the same or different metals and can have the same or different thicknesses. The composite sheet of the invention includes a metal oxide coating MO as an oxide of the outermost metal coating, as in Sheet/M/MO/L2 and Sheet/L1/M/MO/L2 composite structures, however the composite sheet may also include oxide coatings of the intermediate metal coatings, such as, for example, Sheet/L1/M/MO/L2/M/MO/L3 composite structures. Similarly, in structures having more than one organic coating, the individual organic coatings can have the same or different composition and/or thickness. Each metal coating can be adjacent to one or more metal coatings wherein the metal can be the same or different. Similarly, each organic coating can be adjacent one or more organic coatings, wherein the adjacent organic coatings can be the same or different. The sheet layer can be coated on one side, as in the structures described above, or on both sides such as in, for example, L2/MO/M/Sheet/M/MO/L2, L2/MO/M/L1/Sheet/L1/M/MO/L2 structures.

In one embodiment of the present invention, one or both sides of the moisture vapor permeable sheet layer comprises a porous outer surface, such as a fibrous surface or a porous film that is coated with the organic, metal and synthetic metal oxide coatings. The polymeric and metal coatings are deposited on the porous surface such that only the exposed or "outer" surfaces of the fibers or film on the coated side(s) are coated, without covering the pores thereof. "Outer surfaces" include the internal surfaces of the walls of the interstitial spaces or pores, such as those between the fibers of a porous fabric sheet, as well as the fiber surfaces that are exposed when viewed from the outer surface of the sheet layer on the coated side(s), but the surfaces of fibers in the interior structure of the fabric remain uncoated. Since the metal oxide coating covering the metal coating is formed by oxidizing the deposited metal, the metal oxide conforms to the morphology of the sheet surface, leaving the interstitial spaces or pores of the moisture vapor permeable sheet substantially uncovered. By "substantially uncovered" is meant that at least 35% of the interstitial spaces or pores are free of coating. As a result, the moisture vapor transmission rate of the composite sheet of the invention is unaffected, and is at least about 80%, even at least about 85%, and even at least about 90% of the moisture vapor transmission rate of the starting moisture vapor permeable sheet measured prior to depositing the polymeric and metal coatings.

Moisture Vapor Transmission Rate (MVTR) is a measure of the moisture vapor permeability of a material and was measured according to ASTM F1249, which is hereby incorporated by reference, under the conditions of 23° C. and 85% Relative Humidity, and is reported in units of $g/m^2/24$ hr. Comparisons of the moisture vapor permeability of a coated composite sheet of the present invention to the moisture vapor permeability of the uncoated starting sheet were conducted as described in U.S. patent application Ser. No. 10/924,218.

The moisture vapor permeable composite sheets of the invention are corrosion resistant, as they have been found to be substantially free of visible signs of corrosion after exposure to steam at 90° C. (referred to herein as "Steam Test," described in the Test Methods section). Advantageously, the synthetic metal oxide coating is coated with a hydrophobic or liquid repellent top coating to further protect against the penetration of moisture to the metal coating. Metallized samples according to the invention protected with a synthetic metal oxide coating and an outer hydrophobic or water repellent organic coating, when handled with bare hands moist with perspiration and then exposed to an environmental chamber at a temperature of 90° C. and a relative humidity of 90% for 5 days (referred to herein as "Corrosion Resistance Test," described in the Test Methods section), are substantially free of any visible signs of corrosion.

Suitable moisture vapor permeable sheet layers are porous sheets, which include woven fabrics, such as sheets of woven fibers or tapes, or nonwoven fabrics, such as flash-spun plexifilamentary sheets, spunbond nonwoven sheets, spunbond-meltblown nonwoven sheets, spunbond-meltblown-spunbond nonwoven sheets, porous moisture vapor permeable films, such as microporous films, microperforated films, paper and laminates that include a nonwoven or woven fabric or scrim and a porous moisture vapor permeable film. The starting sheet layer can comprise a moisture vapor permeable sheet that has been coated using conventional coating methods. For example, sheets currently used in the construction industry include sheets of woven tapes that have been coated with a polymeric film layer and microperforated. The sheet layer may be formed from a variety of polymeric compositions. For example, sheets used in the construction industry are typically formed from polyolefins such as polypropylene or high density polyethylene, polyesters, or polyamides.

In one embodiment, the moisture vapor permeable sheet is a flash spun plexifilamentary polyolefin sheet such as Tyvek® flash spun high density polyethylene, available from E. I. du Pont de Nemours and Company (Wilmington, Del.). Suitable flash spun plexifilamentary film-fibril materials may also be made from polypropylene. The moisture vapor permeable sheet can be a laminate of a flash spun plexifilamentary sheet with one or more additional layers, such as a laminate comprising a flash spun plexifilamentary sheet and a melt-spun spunbond sheet. Flash spinning processes for forming web layers of plexifilamentary film-fibril strand material are disclosed in U.S. Pat. No. 3,081,519 (Blades et al.), U.S. Pat. No. 3,169,899 (Steuber), U.S. Pat. No. 3,227,784 (Blades et al.), U.S. Pat. No. 3,851,023 (Brethauer et al.), the contents of which are hereby incorporated by reference.

The moisture vapor permeable sheet for use as the starting sheet in the invention can be a commercially available house wrap or roof lining product, such as those described in U.S. patent application Ser. No. 10/924,218.

Microporous films are well known in the art, such as those formed from a mixture of a polyolefin (e.g., polyethylene) and fine particulate fillers, which is melt-extruded, cast or blown into a thin film and stretched, either mono- or bi-axially to form irregularly shaped micropores which extend continuously through the thickness of the film. U.S. Pat. No. 5,955,175 discloses microporous films, which have nominal pore sizes of about 0.2 micrometer. Microporous films can be laminated between nonwoven or woven layers using methods known in the art such as thermal or adhesive lamination.

Microperforated films are formed by casting or blowing a polymer into a film, followed by mechanically perforating the film, as generally disclosed in European Patent Publication No. EP 1 400 348 A2, which indicates that the microperforations are typically on the order of 0.1 mm to 1.0 mm in diameter.

The thickness of the metal and polymeric coatings are preferably controlled within ranges that provide a composite sheet having an emissivity no greater than about 0.20, even no greater than about 0.15, and even no greater than about 0.10. The thickness and the composition of the outer polymeric coating are selected such that, in addition to not substantially changing the moisture vapor permeability of the sheet layer, it does not significantly increase the emissivity of the metallized substrate. The composition of the outer polymeric coating has a low infrared absorption in order to minimize the emissivity of the composite sheet. The outer polymeric coating preferably has a thickness between about 0.05 µm and 2.5

μm, which corresponds to a weight of between about 0.15 g/m² and 1.9 g/m². When an intermediate coating is used, the combined thickness of the intermediate and outer polymeric coatings is preferably no greater than about 2.5 μm, even no greater than about 2.0 μm, even no greater than about 1.5 μm so that the pores on the surface of the moisture vapor permeable sheet are substantially uncovered. Such coating processes are further described in U.S. Patent Publication No. 2004-0028931-A1, filed Jun. 19, 2003, incorporated herein by reference in its entirety.

Suitable compositions for the polymeric coating(s) include polyacrylate polymers, oligomers and compounds, and vinyl polymers, oligomers and compounds, such as those described in U.S. Pat. No. 6,083,628 and WO 98/18852, incorporated herein by reference in their entireties.

Water condensed on the surface of the moisture vapor permeable metallized composite sheet of the invention can more easily penetrate a hydrophilic polymeric coating, on which water spreads and wets immediately upon contact, than a hydrophobic coating, on which water does not wet but remains in the form of droplets upon contact, or a liquid repellent coating, on which liquids including water, oil and alcohol do not wet. Water droplets condensing on the surface of hydrophobic or liquid repellent coatings have a large contact angle, typically at least 100 degrees, and consequently limited contact area between the water and the surface even at elevated temperatures, e.g. 90° C. By contrast, moisture that condenses on hydrophilic coatings has a greater contact area and sufficient wetting so that it is more likely to penetrate through hydrophilic coatings, bringing with it dissolved salts which promote corrosion of the metal coating. Hydrophobic or repellent coatings therefore provide greater protection of the metal coating from corrosion.

Metals suitable for forming the metal coating(s) of the composite sheets of the present invention include aluminum, tin, zinc, silicon, scandium, titanium, vanadium, chromium, manganese, cobalt, nickel, yttrium, zirconium, niobium, molybdenum, indium and their alloys. The metal alloys can include other metals, so long as the alloy composition provides a low emissivity composite sheet. Each metal coating has a thickness between about 15 nm and 200 nm, or between about 30 nm and 60 nm. In one embodiment, the metal coating comprises aluminum. The metal coating is deposited in vacuum by resistive evaporation, electron beam metal vapor deposition, or sputtering. If the metal coating is too thin, the desired thermal barrier properties will not be achieved. If the metal coating is too thick, it can crack and flake off. When the composite sheet of the present invention is used as a house wrap or roof lining, the metal coating reflects infrared radiation and transmits little infrared radiation, providing a thermal barrier that reduces energy loss and keeps the building cooler in the summer and warmer in the winter. The synthetic metal oxide coating is formed by exposing the metal coating to a plasma containing oxygen immediately following the metal deposition, in vacuum. The thickness of the metal oxide coating can be less than about 10 nm, even less than about 5 nm.

The thermal barrier properties of a material can be characterized by its emissivity. Emissivity is a measure of the heat absorbance and reflectance properties of a material and is measured according to ASTM C1371-98 and ASTM C408-71 using a Model AE D&S Emissometer (manufactured by Devices and Services Company, Dallas, Tex.) with the metallized side of the sheet samples facing the radiation source. Emissivity is the ratio of the power per unit area radiated by a surface to that radiated by a black body at the same temperature. A black body therefore has an emissivity of one and a perfect reflector has an emissivity of zero. The lower the emissivity, the higher the thermal barrier properties.

FIG. 1 is a schematic diagram of an apparatus 10 suitable for vapor-deposition coating of a sheet layer with organic and metal coatings under vacuum. In the description that follows, the term monomer is used to refer to vaporizable monomers, compounds, oligomers, and low molecular weight polymers. A vacuum chamber 12 is connected to a vacuum pump 14, which evacuates the chamber to the desired pressure. Suitable pressures are between $2\times10^{-4}$ to $2\times10^{-5}$ Torr ($2.66\times10^{-5}$ to $2.66\times10^{-6}$ kPa). Porous moisture vapor permeable sheet 20 is fed from unwind roll 18 onto a rotating drum 16, which rotates in the direction shown by arrow "A", via guide roll 24. The surface speed of drum 16 is generally in the range of 1 to 1000 cm/second. The sheet passes through several deposition stations after which it is picked off of the surface of the rotating drum by guide roller 26 and taken up by wind-up roll 22 as a coated composite sheet. Drum 16 can be cooled to a temperature specific to the particular monomer being used to form the polymeric coating, and can be cooled to about −20° C. to facilitate condensation of the monomer. After unwinding from roll 18, the sheet layer passes through optional plasma pre-treatment unit 36, where the surface of the sheet is exposed to a plasma to remove adsorbed oxygen, moisture, and any low molecular weight species on the surface of the sheet prior to forming the metal or monomer coating thereon. The surface energy of the substrate is generally modified to improve wetting of the surface by the coating(s). The plasma source may be low frequency RF, high frequency RF, DC, or AC. Suitable plasma pre-treatment methods are described in U.S. Pat. No. 6,066,826, WO 99/58757 and WO 99/59185.

An intermediate organic coating is optionally formed on the sheet layer prior to depositing the metal coating. In one embodiment, an organic monomer, oligomer or compound (also referred to herein simply as "monomer") is deposited on the moisture vapor permeable sheet layer by monomer evaporator 28, which is supplied with liquid monomer from a reservoir 40 through an ultrasonic atomizer 42, where, with the aid of heaters (not shown), the monomer liquid is instantly vaporized, i.e., flash vaporized, so as to minimize the opportunity for polymerization or thermal degradation prior to being deposited on the sheet layer. The monomer is preferably degassed prior to injecting it as a vapor into the vacuum chamber, as described in U.S. Pat. No. 5,547,508, which is hereby incorporated by reference. The specific aspects of the flash evaporation and monomer deposition process are described in detail in U.S. Pat. Nos. 4,842,893; 4,954,371; and 5,032,461, all of which are incorporated herein by reference.

The flash-vaporized monomer condenses on the surface of the sheet and forms a liquid monomer film coating. The monomer coating is thin enough that it does not substantially cover the pores of the sheet layer so that the composite sheet has a moisture vapor permeability of at least about 80% that of the starting sheet layer. The condensed liquid monomer is solidified within a matter of milliseconds after condensation onto the sheet using a radiation curing means 30. Suitable radiation curing means include electron beam and ultraviolet radiation sources which cure the monomer film coating by causing polymerization or cross-linking of the condensed coating. If an electron beam gun is used, the energy of the electrons should be sufficient to polymerize the coating in its entire thickness as described in U.S. Pat. No. 6,083,628, which is incorporated herein by reference. The polymerization or curing of monomer and oligomer coatings is also described in U.S. Pat. Nos. 4,842,893, 4,954,371 and 5,032, 461. Alternately, an oligomer or low molecular weight polymer can solidify simultaneously with cooling. For oligomers or low MW polymers that are solid at room temperature, curing may not be required as described in U.S. Pat. No. 6,270,841 that is incorporated herein by reference.

After depositing the optional intermediate organic coating, the coated sheet then passes to metallization system 32, where the metal coating is deposited on the solidified and cured organic coating via resistive evaporation, sputtering, or electron beam evaporation. When a resistive metal evaporation system is used, the metallization system is continually provided with a source of metal from wire feed 44.

Following the metallization step, the metallized sheet is passed to plasma post-treatment unit 50, where the metal coating is exposed to an oxygen-containing plasma at a sufficient energy level and for a sufficient amount of time for the free oxygen to react with a portion of the metal coating to form a synthetic metal oxide coating covering the metal coating. The free oxygen can be in the form of oxygen gas, air, a mixture of oxygen and nitrogen, a mixture of gases including oxygen gas and one or more noble gases, oxides of nitrogen or ozone.

The plasma source is preferably RF-driven advantageously equipped with a magnetron, which is capable of focusing the charged plasma species on the metallized sheet surface within a small space for maximum interaction with the surface of the metal coating. When the moisture vapor permeable starting sheet is a fibrous sheet, the plasma source is controlled so as to cover the vertical sides of the fibers as the thickness of the metallized coatings decreases to zero at the transition from the metallized to the non-metallized internal surface of the sheet. Films, on the other hand, are continuous and tend to be flat and smooth, and when metallized, the metal coating and a protective oxide formed on the metal coating conform to the original morphology of the film surface. It is therefore easier to protect a metallized film with a surface oxide than a fibrous metallized sheet having numerous discontinuities at fiber cross-over points. Advantageously, the plasma source has a power level between about 0.25 kW and about 10 kW. Suitable plasma post-treatment methods are described in U.S. Pat. No. 6,066,826, WO 99/58757 and WO 99/59185.

The oxidation of the metal coating can be controlled by varying the power level of the plasma source and/or by varying the speed of rotating drum 16, so as to vary the exposure time of the metal coating to the plasma.

Advantageously, the surface of the metal coating is exposed to the oxygen-containing plasma for between about 5 milliseconds and about 5000 milliseconds. The resulting metal oxide coating contains an oxide or mixture of an oxide and other compounds that components of the plasma may form, by reacting with the metal of the metal coating, and has a thickness of less than about 10 nm, advantageously less than about 5 nm. The synthetic metal oxide coating inhibits corrosion and the formation of undesirable hydrated compounds when the composite sheet is subsequently exposed to moisture.

Following the formation of the metal oxide coating, the metallized sheet then passes to the outer organic coating deposition station. The outer organic coating is deposited in a similar process as described above for the intermediate organic coating using evaporator 128, monomer reservoir 140, ultrasonic atomizer 142, and radiation curing means 130. The composition of the outer organic coating can be the same or different than the intermediate organic coating.

Alternatively, it should be understood that rather than being moved over a rotating drum, the moisture vapor permeable starting sheet can be fed from an unwind roll to a wind up roll, while passing sequentially through the above described process steps along a linear path. In order to deposit multiple organic coatings and metal coatings, the moisture vapor permeable sheet can be moved back and forth between an unwind roll and a wind up roll (not illustrated).

The thickness of the coating is controlled by the line speed and vapor flux of the flash evaporator used in the vapor deposition process. As the coating thickness increases, the energy of the electron beam must be adjusted in order for the electrons to penetrate through the coating and achieve effective polymerization. For example, an electron beam at 10 kV and 120 mA can effectively polymerize acrylate coatings up to 2 μm thick.

If more than one metal coating and/or more than two organic coatings are desired, additional flash evaporation apparatuses and metallization stations can be added inside the vacuum chamber. Alternately, a sheet layer can be coated in a first pass in the apparatus shown in FIG. 1, followed by rewinding the coated sheet in vacuum and running it in a second pass through the apparatus. Alternately, a separate apparatus can be used for the metallization and organic coating steps. Those of skill in the art will recognize that if it is desired to apply coatings on the reverse side of the sheet layer, a second rotating drum 16 can be added within vacuum chamber 12, with additional plasma pre-treatment units 36, monomer evaporators 28, 128, radiation curing means 30, 130, metallization system 32 and plasma post-treatment units 50, which can be operated independently as desired.

The metallized composite sheets of the present invention are especially suitable for use as construction barrier layers in roof and wall systems in building construction. The highly reflective metallized surface of the composite sheet provides a low emissivity surface that enhances the performance of the insulation and improves the energy efficiency of wall and roof systems, thus reducing fuel costs for the building owner. Additional benefits include minimization of condensation inside wall and roof structures in cold climates and shielding of the building from excessive heat during the summer months. In one embodiment of the present invention, the moisture vapor permeable composite sheet is used in a wall or roof system and has an emissivity of less than about 0.20, a moisture vapor permeability of at least about 35 g/m$^2$/24 hr, and a hydrostatic head of at least about 20 cm. The composite sheet is preferably installed in a wall or roof system such that the metallized side is adjacent to an air space. Alternatively, the side opposite the metallized side can be adjacent an air space. It is believed that installing the metallized composite sheet adjacent an air space maximizes the effectiveness of the composite sheet as a thermal barrier by allowing it to transmit little radiant energy or to reflect radiant energy.

In addition to functioning as a thermal barrier, the metallized composite sheets of the present invention can shield a building from electromagnetic frequency radiation (EMF) when installed as house wrap and/or roof lining. The composite sheet attenuates the incoming and/or outgoing EMF signals so that they cannot be transmitted in or out of the building. While aluminum foil or other metallic sheets could be used, such sheets are not moisture vapor permeable which makes them undesirable as building wraps. Standard house wrap and roof lining installation methods can be used to achieve the benefit of EMF shielding. For the most complete protection, the composite sheet should be installed as a wrap in all the walls and the roof.

Test Methods

In the non-limiting examples that follow, the following test methods were employed to determine various reported characteristics and properties. ASTM refers to the American Society of Testing Materials. ISO refers to the International Standards Organization. TAPPI refers to Technical Association of Pulp and Paper Industry.

Steam Test subjects metallized sheet samples to steam and visually assesses the degree of corrosion over time. A metallized sample is taped on a piece of glass covering a container of water at a temperature of 90° C., the sample at about 2.5 cm from the surface of the water with the metallized side of the sample facing the water. Water condenses on the metallized surface of the sample, which is visually examined until signs of gray or dark gray discolorations appear, at which time the sample is considered failed.

Corrosion Resistance Test subjects metallized sheet samples to conditions that promote corrosion, including steam and the presence of salts in the form of residual perspiration, and visually assesses the degree of corrosion over time. Ten specimens of a particular sample touched by bare hands moist with perspiration and one untouched specimen of the sample were suspended in an environmental chamber at 90° C. and 90% relative humidity. The specimens were examined on a daily basis. Any discoloration was determined as a failure.

Thickness of vapor deposited polymeric coatings was measured on a smooth film that was attached to the samples and underwent the exact metallization and coating treatments as the samples by interferometry and is reported in micrometers (μm).

Thickness of metal coatings was measured on cryomicrotomed specimens using transmission electron microscopy and is reported in nanometers (nm).

AC Impedance was measured by electrochemical impedance spectroscopy. The metallized surface of a metallized sample is placed in contact with a 3% aqueous NaCl solution at 30° C. and changes in impedance of the metallized surface (attributed to corrosion) are measured via frequency scans (0.01 Hz to 10 kHz).

EXAMPLES

The abbreviations defined below are used in the Examples that follow:
Monomer/oligomer compositions:
  SR833S=Tricyclodecane Dimethanol Diacrylate
  SR9003=Propoxylated Neopentyl Glycol Diacrylate
  HDODA=Hexanediol Diacrylate
  Zonyl® TM=Fluorinated Telomer B Methacrylate
SR833S, SR9003 and HDODA are commercially available from Sartomer Company (Exton, Pa.). Zonyl®TM Fluorinated Telomer B Methacrylate is available from E. I. du Pont de Nemours and Company (Wilmington, Del.). The above abbreviations are used in the Examples for the polyacrylate coating formed by curing the corresponding monomer. As compared with each other, SR9003 is relatively hydrophobic as compared with SR833S which is relatively hydrophilic. As compared with both SR9003 and SR833S, Zonyl® TM is highly hydrophobic and relatively oleophobic.

Examples 1-4 and Comparative Example 1

This example of the present invention illustrates the formation of a protective aluminum oxide coating in a moisture vapor permeable metallized composite sheet by treating the aluminum coating with an oxygen plasma in vacuum, and compares the performance with a similar moisture vapor permeable metallized composite sheet having a natural aluminum oxide coating formed by exposure of the aluminum to air at ambient conditions.

Samples of Tyvek® 1560B (available from E. I. du Pont de Nemours & Co., Wilmington, Del.) having a basis weight of 60 g/m$^2$ and samples of ultrahigh density polyethylene film (UHDPE) were attached on a rotating drum of a web metallization machine within a vacuum chamber equipped with plasma treatment, a nozzle capable of introducing acrylic monomer vapor and an electron gun capable of curing the acrylic monomer. Half of the circumference of the rotating drum was covered by the Tyvek® sample and the other half by the film, in each case covering the full width of the drum. The vacuum chamber was pumped down to less than 5×10$^{-4}$ Torr and the samples were exposed to oxygen plasma pretreatment at 1 kW power using a RF power supply with a frequency set at 340 kHz for a residence time of 395 ms. Subsequently, the samples were metallized with aluminum of 99.89% purity to an average optical density of 2.9 as measured on the Tyvek® samples. The machine was then vented to the air surrounding the machine, and the samples were exposed to ambient atmospheric conditions to allow the natural aluminum oxide to form (Comparative Example 1).

The experiment was repeated, except that immediately after metallization and while still in vacuum, the samples were exposed to oxygen plasma using the same RF power supply as in Comparative Example 1 (frequency set at 340 kHz) for a residence time of 395 ms (Examples 1-4). Oxygen was used as the plasma gas for the pre- and post-treatment. The power level used for the oxygen plasma pretreatment was 1 kW in each example. The power level used for the oxygen plasma post-treatment was varied from 0.2 kW to 2 kW, as indicated in Table 1. The steam test performance of the samples was assessed within 24 hours after production, and again at least two weeks after production. The results are indicated in Table 1.

TABLE 1

| Sample | Plasma Post-treatment Power Level (kW) | Time to failure per Steam Test when tested within 24 hours after production (min) | Time to failure per Steam Test when tested at least 2 weeks after production (min) |
| --- | --- | --- | --- |
| Comparative Example 1 | N/A | 5 | 10 |
| Example 1 | 0.20 | 5 | 15 |
| Example 2 | 0.25 | 5 | 20 |
| Example 3 | 1 | 10 | 21-35 |
| Example 4 | 2 | 10 | 20-35 |

The steam test data in Table 1 indicate that the samples post-treated with oxygen plasma at 1 kW or higher perform much better in the steam test than Comparative Example 1 which was metallized but not exposed to oxygen plasma after metallization. When the steam test was performed within 24 hours after the samples were prepared, the samples post-treated with oxygen plasma at 1 kW or higher outperformed Comparative Example 1 by twice the exposure time to steam before failing. When the steam test was performed two weeks after the samples were prepared, plasma post-treated samples outperformed Comparative Example 1 by two to three times the exposure time to steam before failing. Prior to the steam test at least two weeks after production, both the oxygen plasma post-treated samples of the invention and the comparative sample were allowed to continue to form the oxide by exposure to ambient conditions. The fact that the post-treated samples performed better when tested within 24 hours, as well as at least two weeks after production, indicates that a protective synthetic aluminum oxide coating is formed by the oxygen plasma post-treatment. Prior to this experiment, it was expected that the comparative examples would form an oxide faster than the plasma post-treated samples since oxygen would have to diffuse through the barrier of the aluminum oxide coating formed by the plasma in the post-treated samples. However, surprisingly, the aluminum oxide formed by the oxygen plasma continues to grow at ambient conditions and forms a more protective coating to steam corrosion than the oxide formed on the comparative samples during the same time period at ambient conditions.

In order to understand the effectiveness of the oxygen plasma in forming aluminum oxide on the surface of the metallized Tyvek® samples and UHDPE films, Electron Spectroscopy for Chemical Analysis (ESCA) or X-Ray Photoelectron Spectroscopy (XPS) was used to characterize the surfaces of Comparative Example 1 and Examples 2 and 3. The samples were analyzed at least two weeks after they were plasma post-treated and exposed to ambient atmosphere. This was enough time to form the natural oxide on both the plasma post-treated and control samples. On the UHDPE films, angle-resolved ESCA (AR-ESCA) was performed at 30 degree and 90 degree photoelectron electron exit angles, which correspond to sampling depths of 5 nm and 10 nm, respectively. The corresponding Tyvek® samples were analyzed at 90 degree exit angle only in order to avoid shadowing artifacts that high points of the relatively rough Tyvek® surface would introduce on the spectra.

Figure 2:
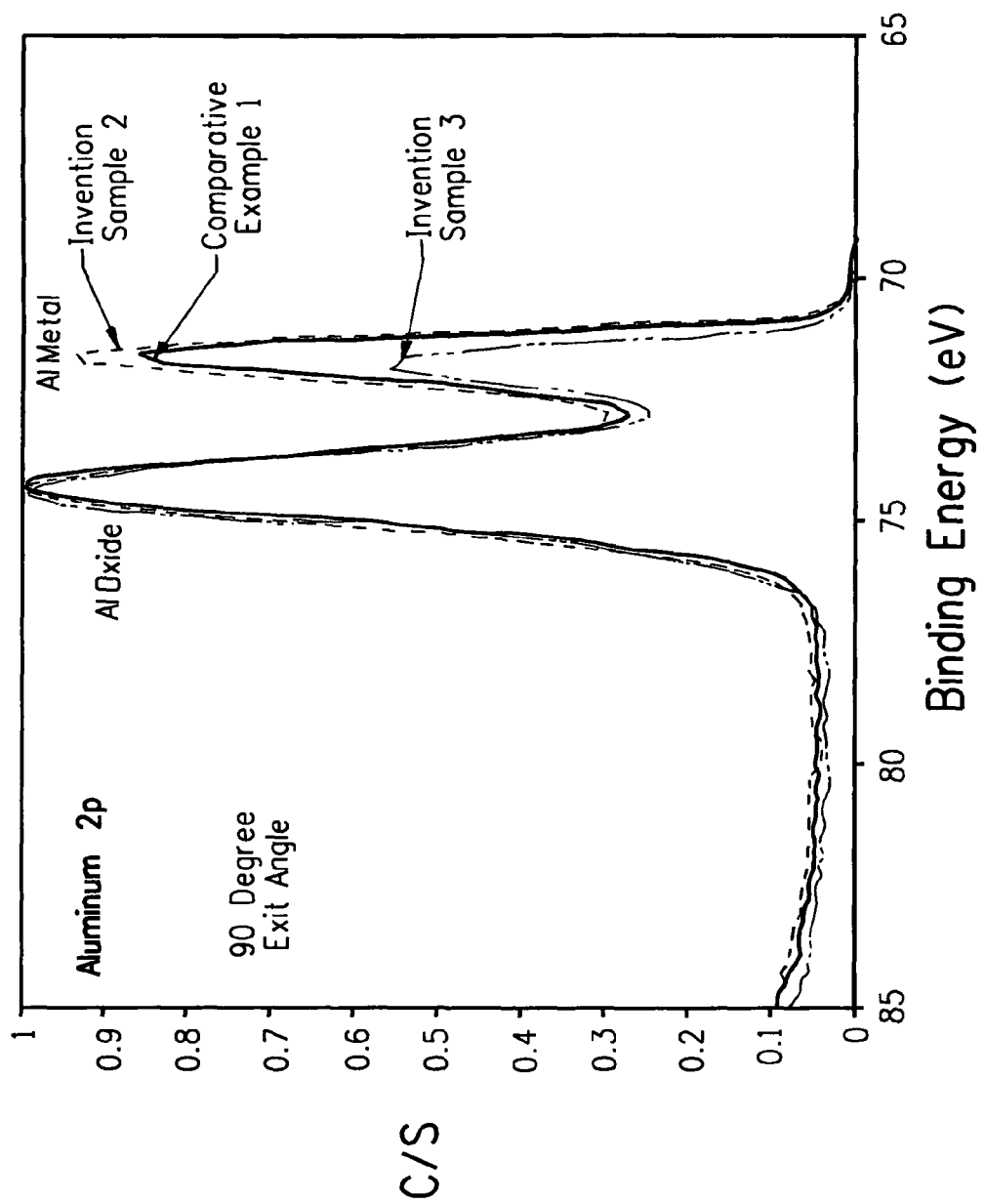
FIG. 2 is a graph of Electron Spectroscopy for Chemical Analysis (ESCA) spectra of the surfaces of a metallized high density polyethylene plexifilamentary film-fibril sheet having naturally formed aluminum oxide thereon, and two high density polyethylene plexifilamentary film-fibril sheets metallized and post-treated in vacuum with oxygen plasma, indicating the presence of both aluminum and aluminum oxide at a surface depth of 10 nm.

FIG. 2 compares the Tyvek® Al 2 p ESCA spectra of Comparative Example 1 and Examples 2 and 3 of the invention. In the spectra overlay, it was observed that the surfaces of all three samples consist of both aluminum metal and aluminum oxide. Since both aluminum metal and aluminum oxide coexist on the surface as measured by ESCA, the thickness of the aluminum oxide as a single continuous coating must be less than 10 nm. In each case the amount of aluminum oxide is greater than aluminum metal. The aluminum metal and aluminum oxide peaks have been curve fitted and their ratios $Al_2O_3/Al$ are shown in Table 2. The $Al_2O_3/Al$ is equal to 1.8 in Example 2, which was treated with oxygen plasma at a power level of 0.25 kW. This is virtually identical to the $Al_2O_3/Al$ ratio of Comparative Example 1 ($Al_2O_3/Al$ ratio of 1.9). This indicates that about the same amount of natural oxide was formed on Comparative Example 1 as on the plasma post-treated Example 2, in which the oxide was formed as a result of the oxygen plasma treatment in vacuum and the subsequent exposure to ambient conditions. However, in Example 3, which was post-treated at 1 kW, considerably greater surface enrichment of aluminum oxide was measured, with an $Al_2O_3/Al$ ratio of 3.2, indicating its oxide coating is thicker than that of Comparative Example 1 or Example 2. It is evident that the power level of the plasma can play a significant role in the oxide formation since Examples 2 and 3 were each exposed to oxygen plasma for 395 ms.

Figure 3A:
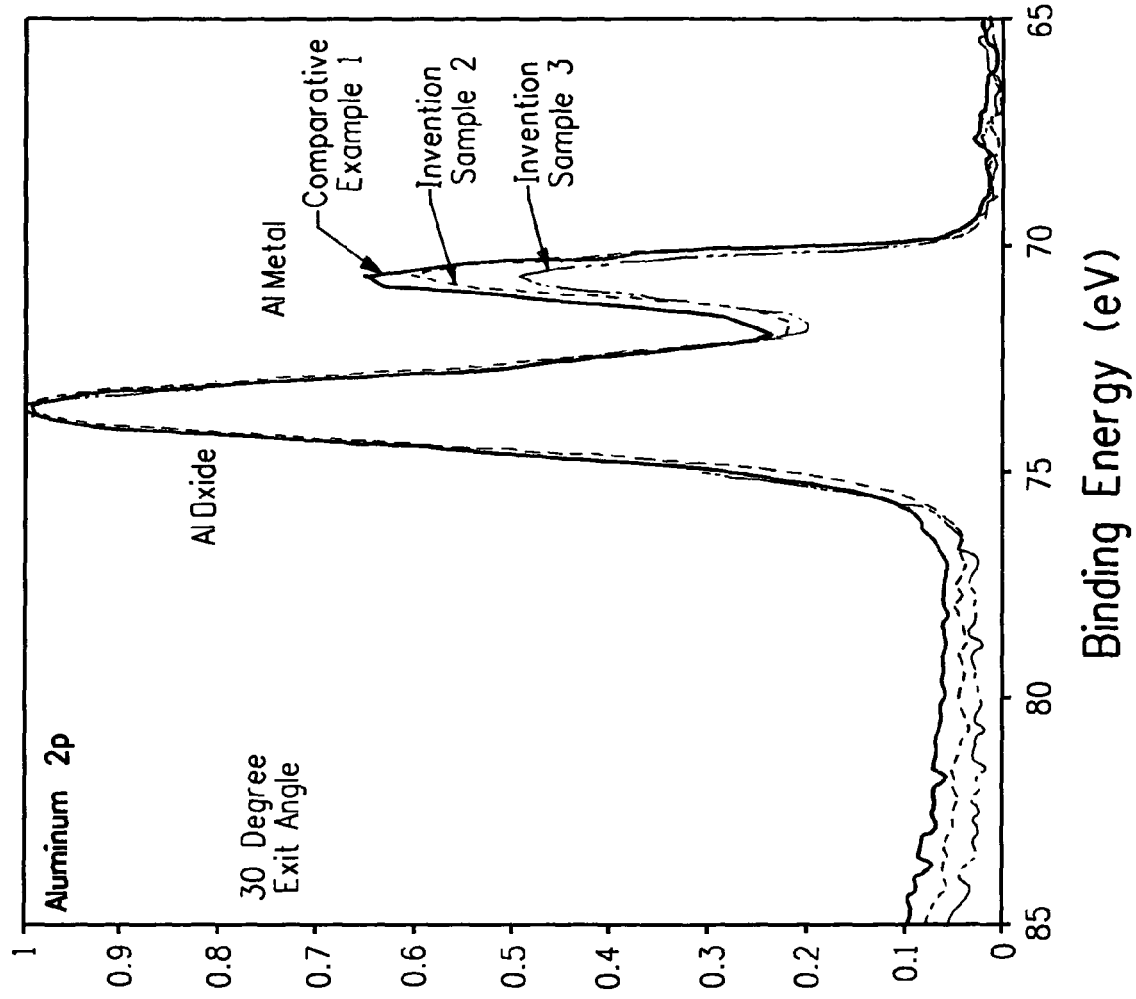
FIGS. 3A and 3B are graphs of ESCA spectra of the surfaces of a metallized UHDPE film having naturally formed aluminum oxide thereon, and two UHDPE films metallized and post-treated in vacuum with oxygen plasma, indicating the presence of both aluminum and aluminum oxide at surface depths of 5 nm (FIG. 3A) and 10 nm (FIG. 3B).
Figure 3B:
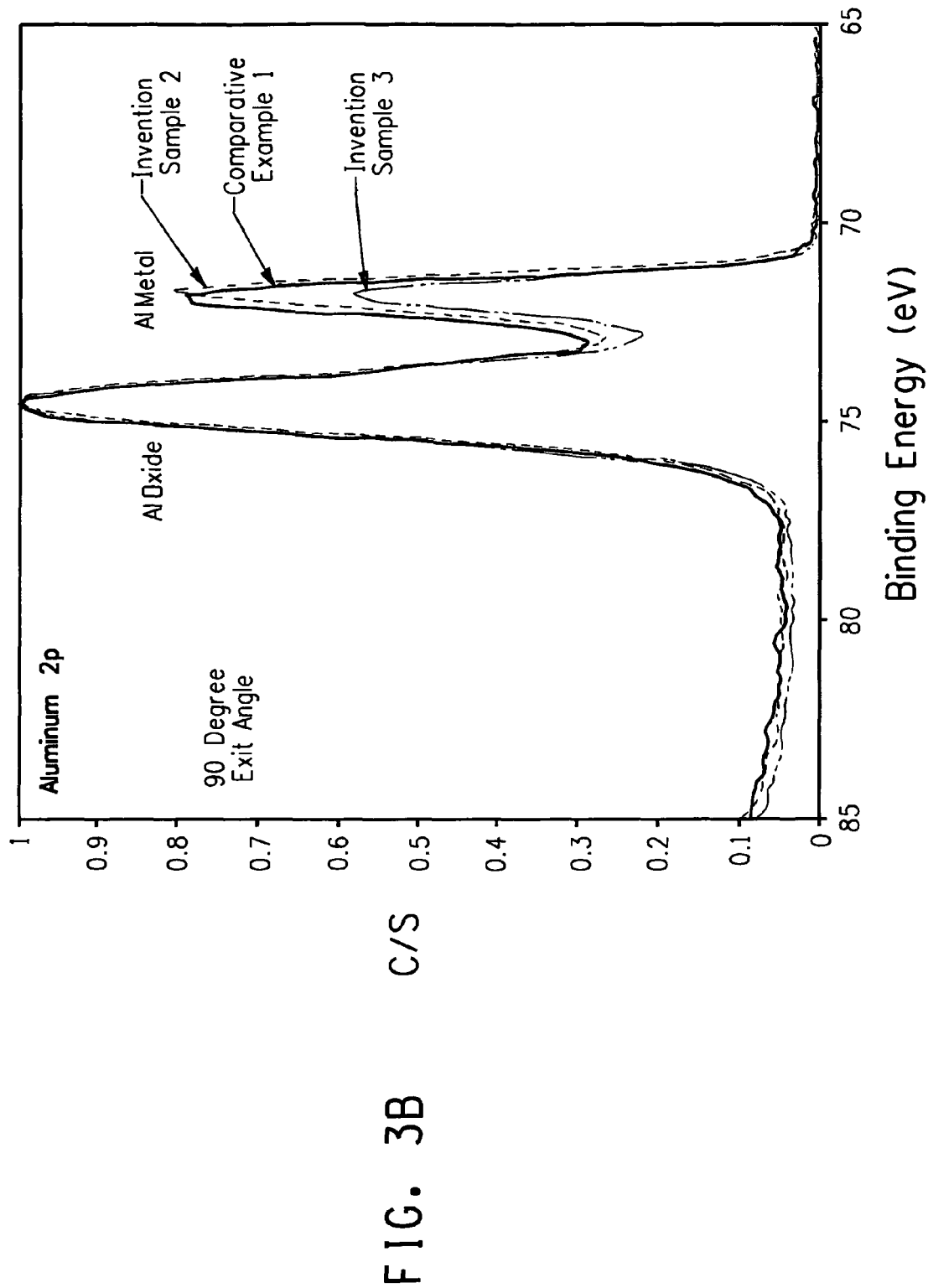

FIGS. 3A and 3B compare the Al 2 p spectra of the film samples of Comparative Example 1 and Examples 2 and 3 at 30 degree and 90 degree photoelectron exit angles, i.e., surface sampling depths of 5 nm and 10 nm, respectively. The spectra indicate that the surface of the UHDPE film samples, like the surface of metallized Tyvek®, consists of aluminum and aluminum oxide and that it is enriched in aluminum oxide. In the transition from a depth of 5 nm to a depth of 10 nm, the amount of aluminum oxide diminishes and the amount of aluminum metal increases proportionally. The surface of Example 3 is consistently more enriched with aluminum oxide than Comparative Example 1 and Example 2, which appear to be nearly identical in terms of amount of aluminum oxide formed. Since aluminum metal is detected at the 30 degree exit angle in all cases, the overall thickness of the aluminum oxide must be less than 5 nm in all cases.

Aluminum oxide is formed on the surface of the aluminum metal coating as a result of the oxidation of the metal by the oxygen plasma in vacuum and from the subsequent exposure of the metal surface to ambient oxygen. Both the plasma post-treated Examples and Comparative Example 1 indicate that aluminum oxide continues to form during sample exposure to atmosphere. Since aluminum oxide is a barrier to oxygen, it could be assumed that the aluminum oxide formed by the oxygen plasma would slow down or stop further oxidation resulting from further exposure to ambient oxygen. If this were the case, metallized samples treated by oxygen plasma would not show improvement in steam test performance after exposure to ambient conditions. Surprisingly, all plasma post-treated samples showed an improved performance to steam test vs. Comparative Example 1.

The corrosion resistance of the UHDPE film samples to 3% aqueous sodium chloride solution at 30° C. was measured using AC impedance testing at least two weeks after the samples were prepared (Table 2). A corrosion resistance of 375 kOhms-cm$^2$ was measured for Example 3, which is a 64% improvement over that of Comparative Example 1, consistent with a corresponding improvement of two to three times in durability as measured by the steam test. The AC impedance measurements verify that the overall oxide structure formed by the oxygen plasma post-treatment and the exposure to ambient oxygen provides a better protection than the native oxide formed only by exposure to ambient conditions and is not porous.

TABLE 2

| Sample | ESCA: % $Al_2O_3$ on UHDPE Film and ($Al_2O_3$/Al Ratio) | | AC Impedance: UHDPE Film | ESCA: % $Al_2O_3$ on Tyvek® and ($Al_2O_3$/Al Ratio) |
| --- | --- | --- | --- | --- |
| | 5 nm sampling depth | 10 nm sampling depth | Corrosion Resistance (kOhms-cm$^2$) | 10 nm sampling depth |
| Comparative Example 1 | 72 (2.7) | 68 (2.1) | 228 | 66 (1.9) |
| Example 2 | 71 (2.7) | 67 (2.1) | N/A | 63 (1.8) |
| Example 3 | 75 (3.7) | 72 (2.9) | 375 | 74 (3.2) |

Examples 5-11 and Comparative Example 2

These examples illustrate the formation of a protective synthetic aluminum oxide coating in a moisture vapor permeable metallized composite sheet by treating the aluminum coating in vacuum with a plasma of oxygen or oxygen blended with other gases, and compares the performance with a similar sheet having a natural aluminum oxide coating formed by exposure of the aluminum to air at ambient conditions.

Samples of Tyvek® 1560B and UHDPE films were prepared as in Examples 1-4. The samples were post-treated with plasmas based on oxygen and oxygen blends with other gases. In both the plasma pretreatment and post-treatment for each sample, a power supply having an alternating current with a frequency of 120 kHz and a power of 1 kW was used at a residence time of 395 ms (unless specified otherwise). In Example 6, an argon gas plasma post-treatment was used prior to the oxygen plasma post-treatment. The gases used in the plasmas and the steam test performance are shown in Table 3 below.

TABLE 3

| Sample | Gases Used in Plasma Pre- and Post-Treatment | Time to failure per steam test when tested within 24 hours after production (min) | Time to failure per steam test when tested at least 2 weeks after production (min) |
|---|---|---|---|
| Comparative Example 2 | Pre-treatment: $O_2$ (no post-treatment) | 1 | 2-3 |
| Example 5 | $O_2$ | 3-6 | 6-15 |
| Example 6 | Pre-treatment: $O_2$, Post-treatment 1: Ar (237 ms and 1 kW) Post-treatment 2: $O_2$ | 3 | 6-15 |
| Example 7 | 80% Ar, 20% $O_2$ | 4 | 5-7 |
| Example 8 | 50% Ar, 50% $O_2$ | 4 | 4-6 |
| Example 9 | 80% He, 20% $O_2$ | 4 | 4-8 |
| Example 10 | Compressed air (nominally 80% $N_2$, 20% $O_2$) | 4 | 4-7 |
| Example 11 | Ambient air (nominally 80% $N_2$, 20% $O_2$) | 8 | 4-15 |

Table 3 shows that metallized samples post-treated with plasmas comprising blends of oxygen with other gases, like oxygen-argon, oxygen-helium, and oxygen-nitrogen outperformed Comparative Example 2 in resistance to corrosion by steam.

Examples 12-15 and Comparative Examples 3-12

This example demonstrates the production of a moisture vapor permeable metallized composite sheet having a repellent coating and a similar composite sheet having a hydrophilic coating, and compares the durability of the samples after being exposed in an environmental chamber at 90° C. and 90% relative humidity per the Corrosion Resistance Test.

Rolls of Tyvek® 1560B 1000 m long by 1 m wide were metallized and plasma treated as in Example 1 in a machine equipped with unwind and wind-up rolls. One rectangular sample 25 cm long by 1 m wide of polyethylene terephthalate (PET) film was attached on the surface of each Tyvek® roll, so that it received exactly the same treatment as the Tyvek®. The PET sample was used to measure the thickness of the top coating by interferometry. Plasma pre- and post-treatment was the same for each sample at a frequency of 40 kHz, an exposure time of 287 ms and a power level of 1 kW. The metallized samples were then coated either with a relatively hydrophilic acrylate, SR9003 or with a repellent formulation of 80% Zonyl® TM and 20% HDODA by vapor deposition. All the process steps were carried out in vacuum in multiple passes. In the first pass, the substrate (Tyvek® 1560B) was pretreated with $O_2$ plasma and coated with a hydrophilic coating; in the second pass, the coated substrate was pretreated again with $O_2$ plasma and metallized with aluminum; in the third pass, the metallized substrate was post-treated with $O_2$ plasma and coated with an optional coating L2(a); in the fourth pass, the metallized substrate was coated with coating L2(b).

Ten metallized Tyvek® samples approximately 18 cm by 18 cm coated with either SR9003 or Zonyl® TM/HDODA (80/20) were handled by pressing fingers moist with perspiration on their metallized surfaces. They were then placed in an environmental chamber set at 90° C. and 90% relative humidity at least two weeks after they were produced. The samples were then evaluated daily for visible signs of corrosion. Control samples, which were not handled, were also evaluated side-by-side in the same chamber, but they did not show any visible signs of corrosion. Typically, the first signs of corrosion were detected as dark gray spots which eventually became white and took the shape of fingers. When the first gray spots appeared samples were considered as failed. Details of the sample preparation and their performance in the Corrosion Resistance Test are shown in Table 4.

TABLE 4

| Sample | $O_2$ Plasma Pre-treatment | L1 (0.4 μm thick) | $O_2$ Plasma Post-treatment | L2(a) | L2(b) (thickness of L2(a) + L2(b), μm) | Corrosion Resistance Test: Pass or Fail (days to failure) |
|---|---|---|---|---|---|---|
| Comparative Example 3 | Yes | No | No | Yes (SR9003) | SR9003 (0.67) | Failed after 1-2 days |
| Comparative Example 4 | Yes | No | No | Yes (SR9003) | SR9003 (1.2) | Failed after 2 days |
| Comparative Example 5 | Yes | No | Yes | No | SR9003 (0.56) | Failed after 1-2 days |
| Comparative Example 6 | Yes | No | Yes | No | SR9003 (0.96) | Failed after 1-2 days |
| Comparative Example 7 | Yes | Yes (SR9003) | No | Yes (SR9003) | SR9003 (1.2) | Failed after 3-4 days |
| Comparative Example 8 | Yes | Yes (SR9003) | Yes | No | SR9003 (0.6) | Failed after 3-4 days |
| Comparative Example 9: Tyvek ® Reflex 3460M/pre-existing natural Al oxide | No | No | No | No | Lacquer (1.5) | Passed 7-17 days (test was ended before sample failed) |
| Comparative Example 10 having pre-existing natural Al oxide | No | No | Yes | No | Zonyl ® TM/HDODA (80/20) (0.5) | Failed after 3-4 days |
| Comparative Example 11 | Yes | No | No | Yes (SR9003) | Zonyl ® TM/HDODA (80/20) (0.5) | Failed after 3-4 days |
| Example 12 | Yes | No | Yes | No | Zonyl ® TM/HDODA (80/20) (0.46) | Passed 7-17 days (test was ended before sample failed) |
| Comparative Example 12 | Yes | Yes (SR9003) | No | Yes (SR9003) | Zonyl ® TM/HDODA (80/20) (0.5) | Failed after 3-4 days |
| Example 13 | Yes | Yes (SR9003) | Yes | No | Zonyl ® TM/HDODA (80/20) (0.5) | Passed 7-17 days (test was ended before sample failed) |
| Example 14 | Yes | Yes (SR9003) | Yes | No | Zonyl ® TM/HDODA (80/20) (0.55) | Passed 17 days (test was ended before sample failed) |

TABLE 4-continued

| Sample | O$_2$ Plasma Pre-treatment | L1 (0.4 μm thick) | O$_2$ Plasma Post-treatment | L2(a) | L2(b) (thickness of L2(a) + L2(b), μm) | Corrosion Resistance Test: Pass or Fail (days to failure) |
|---|---|---|---|---|---|---|
| Example 15 | Yes | Yes (SR833S) | Yes | No | SR833S (0.45) | Passed 17 days (test was ended before sample failed) |

It was observed that composite sheets having SR9003 as an intermediate coating (L1), with or without O$_2$ plasma post-treatment of the aluminum, and SR9003 as the outer coating (L2(b)) failed within 5 days, thus they did not meet the five-day no-corrosion target. Having an intermediate coating of SR9003, increasing the thickness of SR9003 top coating from 0.5 to 1.2 μm, even with the O$_2$ plasma treatment to form the oxide, made only a marginal improvement in the Corrosion Resistance Test performance for some of the samples, from 2 to 4 days. Only combinations of O$_2$ plasma post-treatment and outer coatings of hydrophobic SR833S or liquid repellent/oleophobic Zonyl® TM/HDODA (80/20) about 0.5 μm thick performed as well as our benchmark Tyvek® Reflex 3460M of Comparative Example 9, which had a coating of natural oxide coated with a 1.5 mm thick coating of a lacquer.

What is claimed is:

1. A construction barrier layer comprising:
a porous moisture vapor permeable sheet selected from the group consisting of nonwoven fabrics, woven fabrics, microporous films, microperforated films and composites thereof, having first and second outer surfaces and at least one multilayer coating comprising:
a metal coating having a thickness between about 15 nanometers and 200 nanometers deposited on the first outer surface of the moisture vapor permeable sheet;
a synthetic metal oxide coating having a thickness of less than about 10 nm and having at least 72% Al$_2$O$_3$ as measured by ESCA at a sampling depth of either 5 nm or 10 nm; and
an outer organic coating having a thickness between about 0.05 μm and about 1 μm deposited on the metal layer;
wherein the multilayer coating substantially covers the outer surface of the moisture vapor permeable sheet while leaving the pores substantially uncovered.

2. A construction barrier layer comprising:
a porous moisture vapor permeable sheet selected from the group consisting of nonwoven fabrics woven fabrics, microporous films, microperforated films and composites thereof, having first and second outer surfaces and at least one multilayer coating comprising:
a metal coating having a thickness between about 15 nanometers and 200 nanometers deposited on the first outer surface of the moisture vapor permeable sheet;
a synthetic metal oxide coating having a thickness of less than about 10 nm and having at least a 2.9 Al$_2$O$_3$/Al ratio as measured by ESCA at a sampling depth of either 5 nm or 10 nm; and
an outer organic coating having a thickness between about 0.05 μm and about 1 μm deposited on the metal layer;
wherein the multilayer coating substantially covers the outer surface of the moisture vapor permeable sheet while leaving the pores substantially uncovered.

3. A moisture vapor permeable metallized composite sheet comprising a porous moisture vapor permeable sheet having first and second outer surfaces and at least one multilayer coating comprising:
a metal coating having a thickness between about 15 nanometers and 200 nanometers deposited on the first outer surface of the porous moisture vapor permeable sheet;
a synthetic metal oxide coating having a thickness of less than about 10 nm and having at least 72% Al$_2$O$_3$ as measured by ESCA at a sampling depth of either 5 nm or 10 nm; and
an outer organic coating having a thickness between about 0.05 μm and about 1 μm deposited on the metal oxide coating;
wherein the multilayer coating substantially covers the outer surface of the porous moisture vapor permeable sheet, while leaving the pores thereof substantially uncovered.

4. A moisture vapor permeable metallized composite sheet comprising a porous moisture vapor permeable sheet having first and second outer surfaces and at least one multilayer coating comprising:
a metal coating having a thickness between about 15 nanometers and 200 nanometers deposited on the first outer surface of the porous moisture vapor permeable sheet;
a synthetic metal oxide coating having a thickness of less than about 10 nm and having at least a 2.9 Al$_2$O$_3$/Al ratio as measured by ESCA at a sampling depth of either 5 nm or 10 nm; and
an outer organic coating having a thickness between about 0.05 μm and about 1 μm deposited on the metal oxide coating;
wherein the multilayer coating substantially covers the outer surface of the porous moisture vapor permeable sheet, while leaving the pores thereof substantially uncovered.

* * * * *